United States Patent
Mita et al.

(10) Patent No.: US 8,232,623 B2
(45) Date of Patent: Jul. 31, 2012

(54) SEMICONDUCTOR DEVICE

(76) Inventors: Keiji Mita, Gunma (JP); Masao Takahashi, Saitama (JP); Takao Arai, Gunma (JP)

( * ) Notice: Subject to any disclaimer, the term of this patent is extended or adjusted under 35 U.S.C. 154(b) by 652 days.

(21) Appl. No.: 12/333,418

(22) Filed: Dec. 12, 2008

(65) Prior Publication Data

US 2009/0206376 A1 Aug. 20, 2009

(30) Foreign Application Priority Data

Feb. 18, 2008 (JP) ................................. 2008-035973

(51) Int. Cl.
*H01L 27/102* (2006.01)

(52) U.S. Cl. ................. 257/565; 257/552; 257/E29.183; 257/E29.198; 257/E29.199

(58) Field of Classification Search .................. 257/552, 257/565, E29.007, E29.183, E29.198, E29.199
See application file for complete search history.

(56) References Cited

U.S. PATENT DOCUMENTS

2002/0079554 A1 *  6/2002 Okawa et al. ................. 257/565
2006/0043528 A1 *  3/2006 Ren et al. ...................... 257/565

FOREIGN PATENT DOCUMENTS

JP          06-163562       6/1994
JP          2004-207702     7/2004

* cited by examiner

*Primary Examiner* — Matthew E Warren
(74) *Attorney, Agent, or Firm* — Fish & Richardson P.C.

(57) ABSTRACT

A conventional semiconductor device has a problem that, when a vertical PNP transistor as a power semiconductor element is used in a saturation region, a leakage current into a substrate is generated. In a semiconductor device of the present invention, two P type diffusion layers as a collector region are formed around an N type diffusion layer as a base region. One of the P type diffusion layers is formed to have a lower impurity concentration and a narrower diffusion width than the other P type diffusion layer. In this structure, when a vertical PNP transistor is turned on, a region where the former P type diffusion layer is formed mainly serves as a parasitic current path. Thus, a parasitic transistor constituted of a substrate, an N type buried layer and a P type buried layer is prevented from turning on, and a leakage current into the substrate is prevented.

6 Claims, 8 Drawing Sheets

FIG. 3
(A)
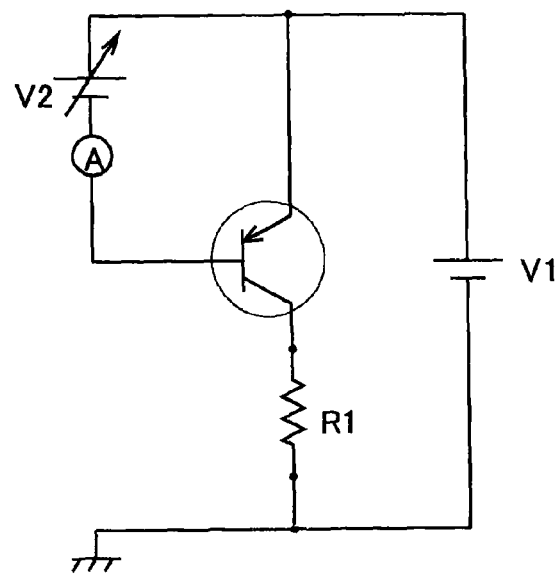
(B)
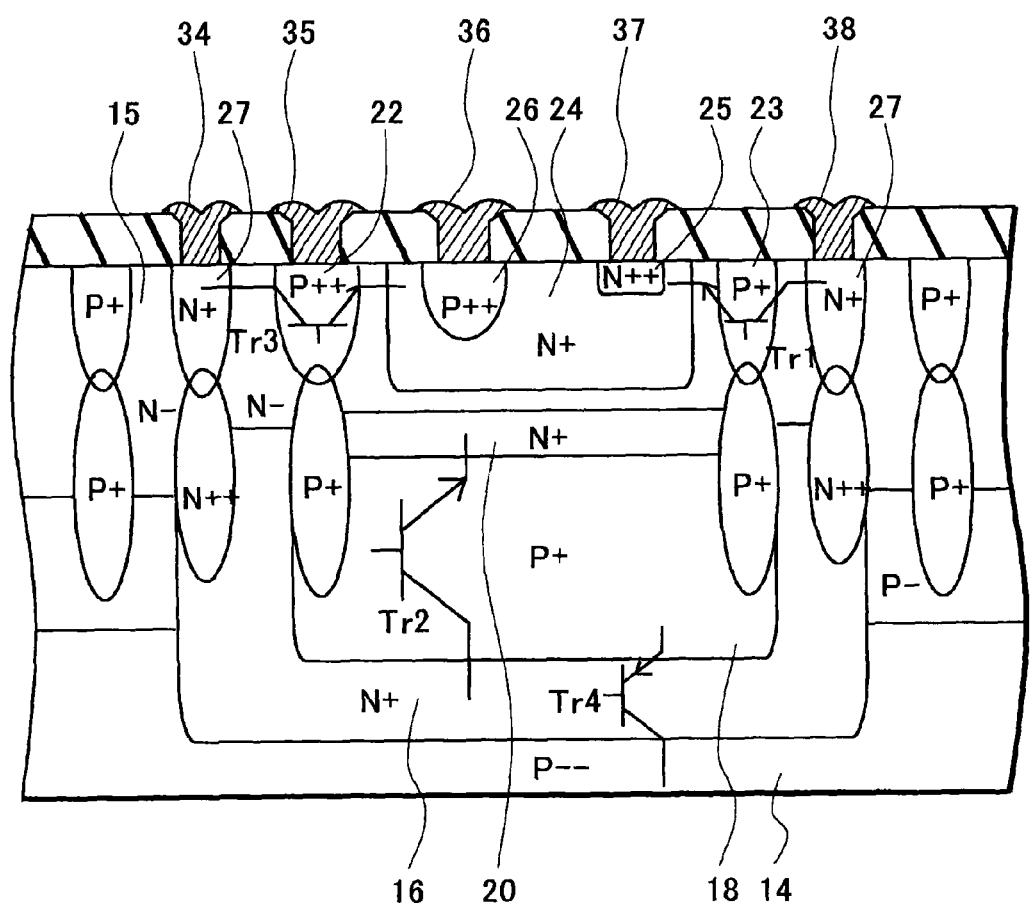

SEMICONDUCTOR DEVICE

This application claims priority from Japanese Patent Application Number JP 2008-035973 filed on Feb. 18, 2008, the content of which is incorporated herein by reference in its entirety.

BACKGROUND OF THE INVENTION

1. Field of the Invention

The present invention relates to a semiconductor device that achieves a reduction in a leakage current to a substrate of a vertical PNP transistor that is used as a power semiconductor element.

2. Description of the Related Art

As an example of a conventional semiconductor device, the following vertical PNP transistor is known. FIG. 8 is a cross-sectional view for describing the conventional vertical PNP transistor.

As shown in FIG. 8, an N type epitaxial layer 112 is formed on a P type silicon substrate 111. In the silicon substrate 111 and the epitaxial layer 112, an N type buried diffusion layer (hereinafter, referred to as a buried layer) 113 and a P type buried layer 114 are formed in an overlapping manner. Moreover, in the epitaxial layer 112, P type diffusion layers 115, 116 as collector regions and an N type diffusion layer 117 as a base region are formed. The P type diffusion layers 115, 116 are connected to the P type buried layer 114. Furthermore, in the N type diffusion layer 117, a P type diffusion layer 118 as an emitter region and an N type diffusion layer 119 as a base lead region are formed.

Then, an oxide film 120 is formed on the epitaxial layer 112. In the oxide film 120, contact holes 121, 122, 123, 124 and 125 are formed. Through the contact holes 121 to 125, an electrode 126, collector electrodes 127, 128, an emitter electrode 129 and a base electrode 130 are formed. This technology is described, for instance, in Japanese Patent Application Publication No. 2004-207702 (pp. 6-7 and FIG. 2).

Described will be a problem that occurs when the vertical PNP transistor shown in FIG. 8 is used in a saturation region. For example, a power supply voltage (13.0 V) is applied to the emitter electrode 129; a voltage which is substantially the same as the power supply voltage (the voltage (12.9 V) having a 0.3 V or less potential difference from the power supply voltage) is applied to the collector electrodes 127, 128; and a desired voltage is applied to the base electrode 130. Note that the power supply voltage (13.0 V) is applied to the electrode 126 connected to the epitaxial layer 112 that is positioned on the outer sides of the P type diffusion layers 115, 116.

Firstly, when the base electrode 130 is applied with 12.3 V, a forward voltage is applied between the emitter and base regions. Accordingly, the vertical PNP transistor is turned on. Then, the voltage applied to the base electrode 130 is decreased (to 12.1 V) and the base current is increased. As a result, a parasitic NPN transistor Tr11 (hereinafter, referred to as a parasite Tr11), constituted of the N type buried layer 113, the P type buried layer 114 and the N type diffusion layer 117 is turned on. At this point, in the parasite Tr11, the P type buried layer 114 serving as a base region is applied with 12.9 V, the N type diffusion layer 117 as an emitter region is applied with 12.1 V, and the N type buried layer 113 as a collector region is applied with 13.0 V.

Meanwhile, a voltage substantially the same as that applied to the parasite Tr11 is also applied to a parasitic NPN transistor Tr12 (hereinafter, referred to as a parasite Tr12) that is constituted of N type diffusion layers 131, 132 (including the epitaxial layer 112 positioned outside the P type diffusion layer 115), the P type diffusion layer 115 and the N type diffusion layer 117. Nevertheless, the parasite Tr12 has two factors to inhibit the transistor operation. The first factor is as follows. The P type diffusion layers 118 disposed around the N type diffusion layer 119 increases the parasitic resistance at an emitter region of the parasite Tr12. Thereby, a voltage applied to a PN junction region between the emitter region and a base region is decreased. The second factor is as follows. The P type diffusion layer 115 is used as the collector region of the vertical PNP transistor, and accordingly its impurity concentration is high. Thereby, it is highly likely that electrons injected from the N type diffusion layer 117 serving as the emitter region of the parasite Tr12 are recombined with positive holes in the P type diffusion layer 115 as a base region. Due to these factors, the parasite Tr11 is turned on preferentially over the parasite Tr12.

After the parasite Tr11 is turned on, potential drop occurs at the N type buried layer 113 (the potential drops from 13.0 V to 11.5 V), thereby turning on a parasite PNP transistor Tr13 (hereinafter, referred to as a parasite Tr13) that is constituted of the P type semiconductor substrate 111, the N type buried layer 113 and the P type buried layer 114. At this point, the N type buried layer 113 as a base region is applied with 11.5 V, the P type buried layer 114 as an emitter region is applied with 12.9 V, and the P type semiconductor substrate 111 as a collector region is applied with 0 V. As a result, the parasite Tr13 is continuously turned on.

To put it another way, by using the vertical PNP transistor in a saturation region, a current leaks from the power source line to the ground line, thus changing the potential of the semiconductor substrate 111, which has been set to be the ground potential. Thus, a malfunction may occur due to a latchup in a peripheral circuit formed on the same semiconductor substrate 111. As a result, due to the leakage current, it is difficult to use a vertical PNP transistor having a structure as shown in FIG. 8 in a high output circuit.

SUMMARY OF THE INVENTION

A semiconductor device according to the present invention has been made in view of the above-described circumstances. The semiconductor device includes a semiconductor layer in which at least a base diffusion layer of one conductivity type, a base lead diffusion layer of the one conductivity type, an emitter diffusion layer of an opposite conductivity type, and a collector diffusion layer of the opposite conductivity type are formed. The base lead diffusion layer is formed while overlapping the base diffusion layer. The emitter diffusion layer is formed while overlapping the base diffusion layer. The collector diffusion layer is formed around the base diffusion layer, and has a first diffusion layer of the opposite conductivity type, and a second diffusion layer of the opposite conductivity type, the second diffusion layer formed to have a higher impurity concentration than the first diffusion layer. The first diffusion layer has a region where the first diffusion layer faces the base lead diffusion layer without the emitter diffusion layer therebetween. Accordingly, in the present invention, the collector diffusion layer is formed of the two diffusion layers whose impurity concentrations and diffusion widths are different from each other. Thereby, a parasitic transistor in the vicinity of the surface of the semiconductor layer is turned on, preventing a leakage current into a substrate.

BRIEF DESCRIPTION OF THE DRAWINGS

FIG. 3A is a circuit diagram for describing a circuit in which the semiconductor device according to the embodiment of the present invention is used; FIG. 3B is a cross-sectional view for describing an operation of a parasitic transistor in the semiconductor device according to the embodiment of the present invention.

DESCRIPTION OF THE INVENTIONS

Figure 1:
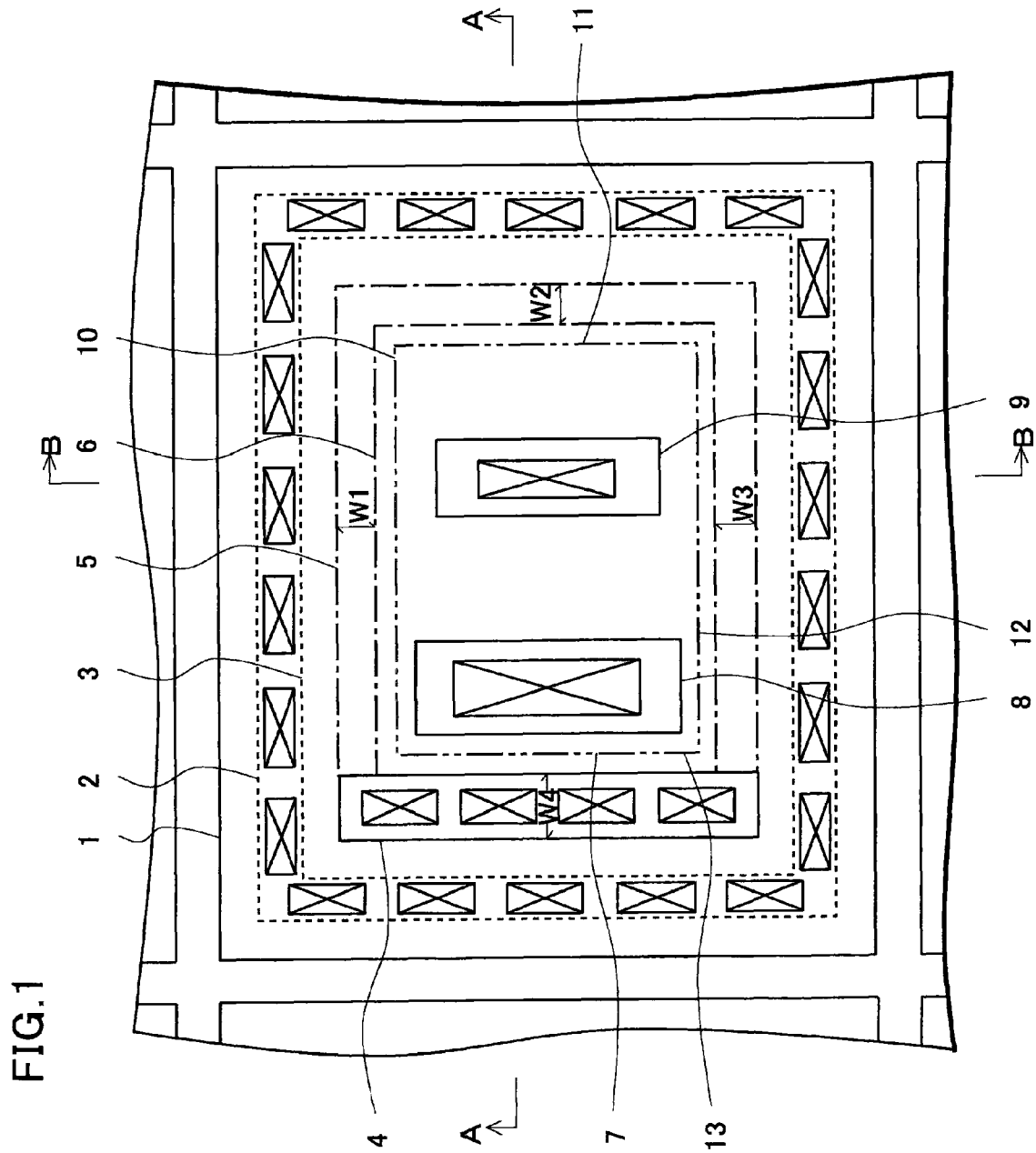
FIG. 1 is a plan view for describing a semiconductor device according to an embodiment of the present invention.
Figure 2:
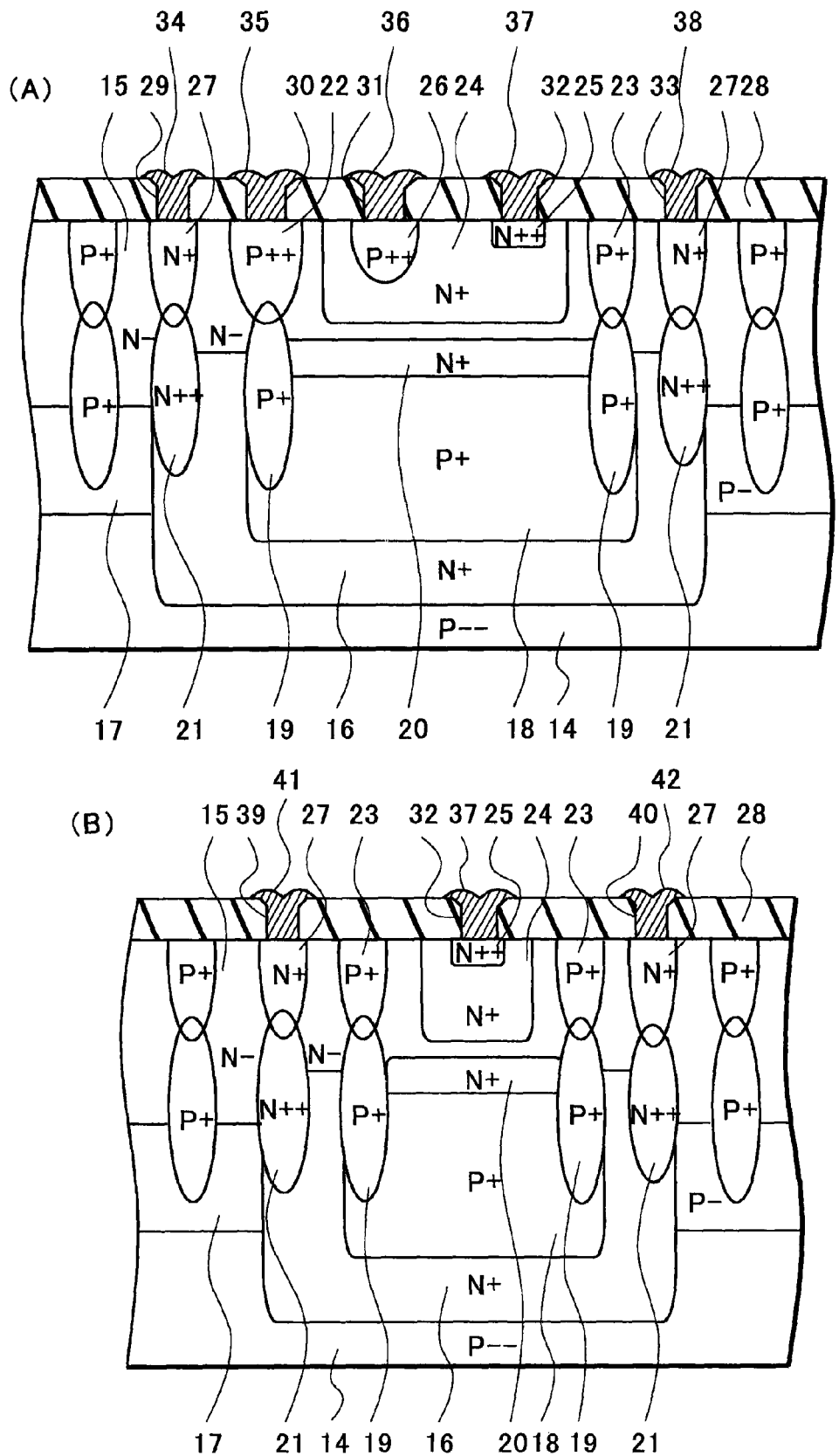
FIG. 2A and FIG. 2B are cross-sectional views for describing the semiconductor device according to the embodiment of the present invention.
Figure 4:
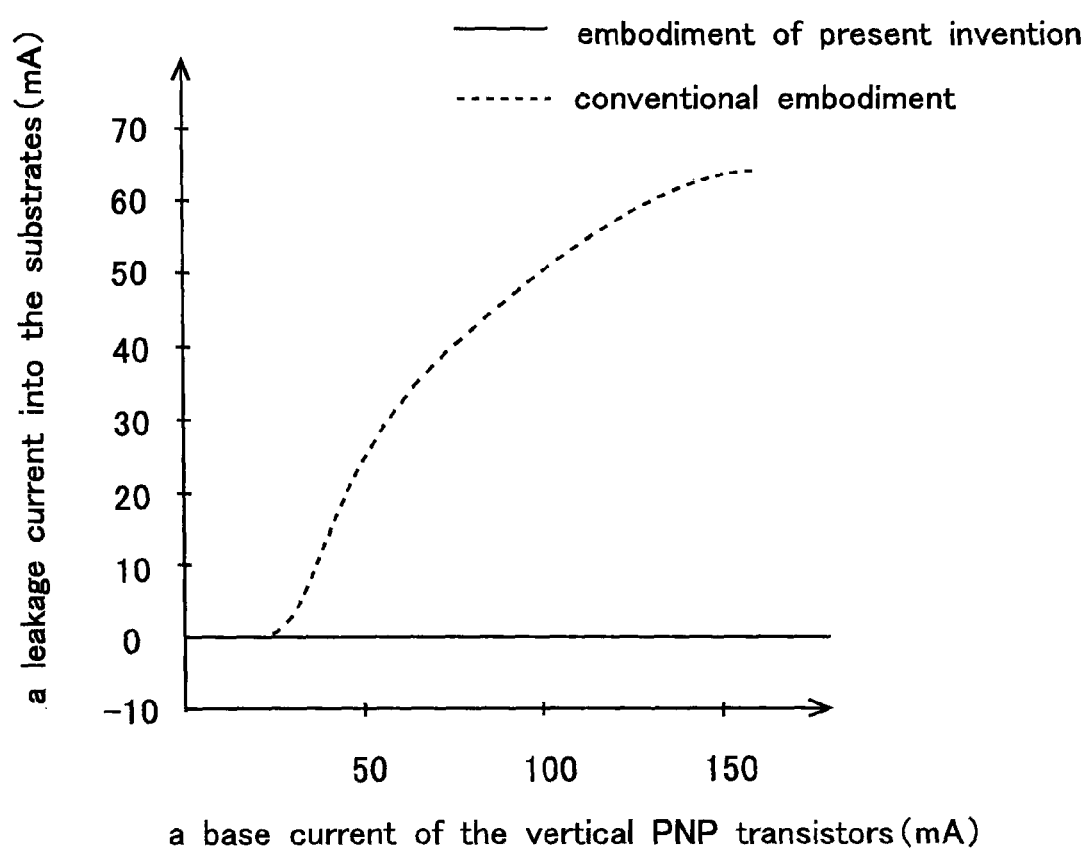
FIG. 4 is a graph for describing a leakage current to a substrate in the embodiment of the present invention.

Hereinafter, specific descriptions will be given of a semiconductor device according to an embodiment of the present invention with reference to FIG. 1 to FIG. 4. FIG. 1 is a plan view for describing a vertical PNP transistor of this embodiment. FIG. 2A is to describe the vertical PNP transistor of this embodiment, and specifically is a cross-sectional view taken in a direction of the line A-A shown in FIG. 1. FIG. 2B is to describe the vertical PNP transistor of this embodiment, and specifically is a cross-sectional view taken in a direction of the line B-B shown in FIG. 1. FIG. 3A is a circuit diagram for describing a circuit in which the vertical PNP transistor of this embodiment is used. FIG. 3B is a cross-sectional view for describing an operation of a parasitic transistor in the vertical PNP transistor of this embodiment. FIG. 4 is a graph for describing a leakage current to a substrate in the vertical PNP transistor of this embodiment.

As shown in FIG. 1, a solid line 1 indicates the edge of a isolation region. The region surrounded by the solid line 1 is where the vertical PNP transistor is formed. The region surrounded by dashed lines 2, 3 indicates an N type diffusion layer formed in an epitaxial layer between the isolation region and a collector region. The region surrounded by a solid line 4 as well as the region surrounded by the solid line 4 and chain lines 5, 6 indicate P type diffusion layers as the collector regions. The region surrounded by a chain double-dashed line 7 indicates an N type diffusion layer as a base region. The region surrounded by a solid line 8 indicates a P type diffusion layer as an emitter region. The region surrounded by a solid line 9 indicates an N type diffusion layer as a base lead region.

As illustrated, the P type diffusion layers as the collector region are disposed to surround the N type diffusion layer (the region surrounded by the chain double-dashed line 7) as the base region. In the collector region, diffusion widths W1, W2 and W3 of the P type diffusion layer (the region surrounded by the solid line 4 and the chain lines 5, 6) are narrower than a diffusion width W4 of the P type diffusion layer (the region surrounded by the solid line 4). Furthermore, the P type diffusion layer (the region surrounded by the solid line 4 and the chain lines 5, 6) is disposed so as to correspond to three sides 10, 11 and 12 of the N type diffusion layer (the region surrounded by the chain double-dashed line 7). Meanwhile, the P type diffusion layer (the region surrounded by the solid line 4) is disposed so as to correspond to one side 13 of the N type diffusion layer (the region surrounded by the chain double-dashed line 7). Moreover, the P type diffusion layer (the region surrounded by the solid line 8) as the emitter region is disposed so as to face the P type diffusion layer (the region surrounded by the solid line 4) with the one side 13 therebetween. This structure increases a region where the N type diffusion layer (the region surrounded by the solid line 9) as the base lead region faces the P type diffusion layer (the region surrounded by the solid line 4 and the chain lines 5, 6) with the three sides 10 to 12 therebetween. Although a detailed description will be given later, by turning on the vertical PNP transistor, a parasitic NPN transistor Tr1 (hereinafter, referred to as a parasite Tr1) (see FIG. 3B) is turned on. Then, the P type diffusion layer (the region surrounded by the solid line 4 and the chain lines 5, 6), positioned in the vicinity of the surface of an epitaxial layer 15 (see FIG. 2A), mainly serves as a current path of the parasite Tr1.

Nextly, regions of the rectangles marked by X therein in FIG. 1 indicate formation regions of contact holes. In the collector region, the contact holes are disposed on the P type diffusion layer (the region surrounded by the solid line 4), whereas the contact holes are not disposed on the P type diffusion layer (the region surrounded by the solid line 4 and the chain lines 5, 6). According to this structure, the diffusion width W4 of the former P type diffusion layer is made wider than the diffusion widths W1 to W3 of the latter P type diffusion layer. Although a detailed description will be given later, by narrowing the diffusion widths W1 to W3 of the P type diffusion layer (the region surrounded by the solid line 4 and the chain lines 5, 6), the P type diffusion layer is made to serve as the current path of the parasite Tr1 (see FIG. 3B).

On the other hand, having a high impurity concentration and the wide diffusion width, the P type diffusion layer (the region surrounded by the solid line 4) mainly functions as the collector region of the vertical PNP transistor. In the collector region of the vertical PNP transistor, the reduction in the contact resistance and the reduction in the parasitic resistance are achieved. Furthermore, the P type diffusion layer (the region surrounded by the solid line 4) having the contact holes disposed thereon is disposed in the vicinity of the P type diffusion layer (the region surrounded by the solid line 8) as the emitter region. With this structure, the current path of the vertical PNP transistor is shortened, and the parasitic resistance in the vertical PNP transistor is reduced. Thus, the current capability is improved.

FIG. 2A is the cross-sectional view taken in the direction of the line A-A shown in FIG. 1. The vertical PNP transistor is mainly formed of a P type single crystal silicon substrate 14, the N type epitaxial layer 15, an N type buried diffusion layer (hereinafter, referred to as a buried layer) 16, a P type buried layer 17, P type buried layers 18, 19 used as collector regions, an N type buried layer 20 used as a base region, an N type buried layer 21, P type diffusion layers 22, 23 used as collector regions, N type diffusion layers 24, 25 used as base regions, a P type diffusion layer 26 used as an emitter region and an N type diffusion layer 27.

The N type epitaxial layer 15 is formed on the P type single crystal silicon substrate 14. Note that, the specific resistance value of the substrate 14 is approximately 40 Ω·cm to 60 Ω·cm, and a substrate having a P type impurity concentration of approximately $3.0\times10^{14}$ is used.

The N type buried layer 16 is formed in the substrate 14 and the epitaxial layer 15. The N type buried layer 16 is formed more deeply in the substrate 14 than the P type buried layer 18. Moreover, the N type buried layer 16 forms PN junction regions with the substrate 14 and the P type buried layer 18, respectively, and isolates the substrate 14 and the P type buried layer 18 from each other with the PN junctions.

The P type buried layer 17 is formed in the entire surface of the chip. For example, the P type buried layer 17 is formed to a depth of approximately 15 µm to 20 µm from the surface of the substrate 14. The P type buried layer 17 is formed by implanting ions of a P type impurity, for example, boron (B) at a dose of $1.0\times10^{12}/cm^2$ to $1.0\times10^{14}/cm^2$. Thus, the P type buried layer 17 is a diffusion region with a low impurity concentration. A region where the P type buried layer 17 overlaps the N type diffusion region acts as an N type region. The formation of the P type buried layer 17 in the substrate 14 prevents the ground resistance from increasing, thus solving the problems such as a latchup. Various design modifications can be made on the impurity concentration of the P type buried layer 17 to obtain a desired ground resistance.

The P type buried layer 18 is formed in the substrate 14 and the epitaxial layer 15. This forming of the P type buried layer 18 in the substrate 14 and the epitaxial layer 15 reduces the collector resistance.

The P type buried layer 19 is formed in the epitaxial layer 15. The P type buried layer 19 is circularly formed around the edge portion of the P type buried layer 18 so that the P type buried layer 19 can overlap the P type buried layer 18.

The N type buried layer 20 expands upward at least from the upper surface of the P type buried layer 18 toward the top surface of the epitaxial layer 15. Meanwhile, the N type buried layer 21 is circularly formed in the edge portion of the N type buried layer 16. Moreover, the P type buried layer 19 is disposed around the N type buried layer 20, and some regions of the N type buried layer 20 and the P type buried layer 19 overlap each other. Furthermore, the N type buried layer 21 is disposed around the P type buried layers 18, 19.

With this structure, the upward expansion width of the P type buried layer 18 in the formation region of the N type buried layer 20 is suppressed to be approximately 1.5 µm to 3.5 µm, thus forming a vertical PNP transistor in which a desired width of the base region is secured. By securing such a desired width of the base region, it is possible to reduce the film thickness of the epitaxial layer 15 while maintaining the breakdown voltage characteristic of the vertical PNP transistor. Additionally, the device size (the size in a thickness direction) is reduced.

The P type diffusion layers 22, 23 are formed in the epitaxial layer 15 by, for example, an ion implantation technique. The P type diffusion layers 22, 23 are connected to the P type buried layer 19. As illustrated, the diffusion width of the P type diffusion layer 22 is wider than that of the P type diffusion layer 23. The impurity concentration of the P type diffusion layer 22 is higher than that of the P type diffusion layer 23. Specifically, in the vicinity of the surface of the P type diffusion layer 22, the diffusion width W4 (see FIG. 1) is approximately 14 µm, and the impurity concentration thereof is approximately $5.0\times10^{18}/cm^3$ to $2.0\times10^{20}/cm^3$. Meanwhile, in the vicinity of the surface of the P type diffusion layer 23, the diffusion width W2 (see FIG. 1) is approximately 7 µm, and the impurity concentration thereof is approximately $5.0\times10^{17}/cm^3$ to $1.0\times10^{19}/cm^3$. Note that, the P type diffusion layer 22 corresponds to the region surrounded by the solid line 4 in FIG. 1, while the P type diffusion layer 23 corresponds to the region surrounded by the solid line 4 and the chain lines 5, 6 in FIG. 1.

The N type diffusion layers 24, 25 are formed in the epitaxial layer 15. The N type diffusion layer 25 is used as the base lead region. By forming the N type diffusion layer 25, the contact resistance is reduced. Note that, the N type diffusion layer 24 corresponds to the region surrounded by the chain double-dashed line 7 in FIG. 1, while the N type diffusion layer 25 corresponds to the region surrounded by the solid line 9 in FIG. 1.

The P type diffusion layer 26 is formed in the N type diffusion layer 24. Note that the P type diffusion layer 26 corresponds to the region surrounded by the solid line 8 in FIG. 1.

The N type diffusion layer 27 is formed in the epitaxial layer 15. The N type diffusion layer 27 is circularly formed so as to surround the P type diffusion layers 22, 23. The N type diffusion layer 27 and the N type buried layer 21 are connected to each other. Specifically, by disposing the N type diffusion layer 27 on the outer periphery of the P type diffusion layers 22, 23 serving as the collector regions, the surface of the epitaxial layer 15 is inverted. This prevents the collector current from flowing into the substrate 14 via the isolation region. Note that the N type diffusion layer 27 corresponds to the region surrounded by the dashed lines 2, 3 in FIG. 1.

An insulating layer 28 is formed on the epitaxial layer 15. Then, contact holes 29 to 33 are formed in the insulating layer 28 by dry etching using, for example, $CHF_3$ or $CF_4$ gas.

In the contact holes 29 to 33, aluminum alloy films such as an Al—Si film are selectively formed. Accordingly, electrodes 34, 38, a collector electrode 35, an emitter electrode 36 and a base electrode 37 are formed therein.

FIG. 2B shows the cross-sectional view taken in the direction of the line B-B shown in FIG. 1. The components of the vertical PNP transistor, which have been described with reference to FIG. 2A, are denoted by the same reference numerals, and the descriptions thereof will be omitted. Meanwhile, the cross section structure shown in FIG. 2B is different from the cross section structure shown in FIG. 2A in that the former structure has a region where the P type diffusion layer 26 (see FIG. 2A) as the emitter region is not disposed between the N type diffusion layer 24 as the base region and the P type diffusion layer 23 as the collector region.

The vertical PNP transistor has the region where the P type diffusion layer 26 (see FIG. 2A) as the emitter region is not disposed between the P type diffusion layer 23 and the N type diffusion layer 24. In this region, although a detailed description will be given later, the parasite Tr1 (see FIG. 3B) that is constituted of the N type diffusion layer 27 (including the N type epitaxial layer 15 positioned outside the P type diffusion layer 23), the P type diffusion layer 23 and the N type diffusion layers 24, 25 (including the N type epitaxial layer 15 positioned on the inner side of the P type diffusion layer 23) is actively turned on when the vertical PNP transistor is turned on. Thereby, the leakage current into the substrate 14 is prevented.

Note that contact holes 39, 40 are formed in the insulating layer 28 by dry etching using, for example, $CHF_3$ or $CF_4$ gas. Then, in the contact holes 39, 40, aluminum alloy films such as an Al—Si film are selectively formed. Accordingly, electrodes 41, 42, connected to the N type diffusion layer 27, are formed therein.

A description will be given of a circuit in which the vertical PNP transistor having been described with reference to FIG. 1 to FIG. 2B is used in a saturation region as shown in FIG. 3A. Now, descriptions will be given of the vertical PNP transistor and a parasitic transistor driven in the vertical PNP transistor while referring to FIG. 3B as appropriate. FIG. 3B shows the cross section taken in the direction of the line A-A in FIG. 1 as similar to FIG. 2A.

As illustrated, the emitter electrode 36 of the vertical PNP transistor is applied with a power supply voltage V1 (for example, 13.0 V). The collector electrode 35 is applied with a voltage (for example, 12.9 V) which is substantially the same as the power supply voltage V1 (the voltage (12.9 V) having a 0.3 V or less potential difference from the power supply voltage V1), the voltage having been adjusted with a resistance R1 (for example, 12 kΩ). The base electrode 37 is applied with a desired voltage (for example, 12.3 V) by a variable voltage V2. Thus, the vertical PNP transistor is turned on. Note that the power supply voltage V1 is applied to the electrodes 34, 38 connected to the epitaxial layer 15 that is positioned on the outer sides of the P type diffusion layers 22, 23.

After the vertical PNP transistor is turned on, the voltage applied to the base electrode 37 is decreased to 12.1 V, and the base current is increased. Then, the parasite Tr1 that is constituted of the N type diffusion layer 27 (including the N type epitaxial layer 15 positioned outside the P type diffusion layer 23), the P type diffusion layer 23 and the N type diffusion layers 24, 25 (including the N type epitaxial layer 15 positioned on the inner side of the P type diffusion layer 23) is turned on.

At this moment, a voltage which is substantially the same as that applied to the parasite Tr1 is also applied to a parasitic NPN transistor Tr2 (hereinafter, referred to as a parasite Tr2) that is constituted of the N type buried layer 16, the P type buried layer 18 and the N type buried layer 20. However, the base width of the parasite Tr1 is narrower than that of the parasite Tr2, and the impurity concentration in the base region of the parasite Tr1 is also low. For this reason, the base current is decreased, thereby increasing the current amplification factor (hFE). With this structure, the parasite Tr1 is turned on, and a region, in the vicinity of the surface of the epitaxial layer 15, where the P type diffusion layer 23 is disposed mainly serves as the current path of the parasite Tr1.

Similarly, a parasitic NPN transistor Tr3 (hereinafter, referred to as a parasite Tr3) that is constituted of the N type diffusion layer 27 (including the N type epitaxial layer 15 positioned outside the P type diffusion layer 22), the P type diffusion layer 22 and the N type diffusion layers 24, 25 (including the N type epitaxial layer 15 positioned on the inner side of the P type diffusion layer 22) is also applied with a voltage which is substantially the same as that applied to the parasite Tr1. As described above with reference to FIG. 1, the diffusion width of the P type diffusion layer 22 is wider than that of the P type diffusion layer 23, and the impurity concentration of the P type diffusion layer 22 is higher than that of the P type diffusion layer 23. Thus, it is highly likely that, in the parasite Tr3, electrons injected from the N type diffusion layer 27 serving as an emitter region are recombined with positive holes in the P type diffusion layer 22 serving as a base region. Then, the base current of the parasite Tr3 is increased higher than that of the parasite Tr1, and the current amplification factor (hFE) of the parasite Tr3 is decreased lower than that of the parasite Tr1. With this structure, the parasite Tr1 is turned on, and a region, in the vicinity of the surface of the epitaxial layer 15, where the P type diffusion layer 23 is disposed mainly serves as the parasitic current path.

Furthermore, while the base electrode 37 of the vertical PNP transistor serves as an emitter electrode of the parasite Tr3, the P type diffusion layer 26 is disposed between the N type diffusion layer 25 and the P type diffusion layer 22. Thus, the parasitic resistance at the emitter region of the parasite Tr3 is increased, and thereby a voltage applied to a PN junction region between the emitter region and a base region is decreased. Thus, the parasite Tr1 is turned on preferentially over the parasite Tr3. On the other hand, in this vertical PNP transistor, since the P type diffusion layer 22 mainly serves as the current path, the reduction in the contact resistance and the reduction in the parasitic resistance are achieved in the collector region.

In other words, the parasite Tr1 has the region where the P type diffusion layer 26 is not disposed between the P type diffusion layer 23 and the N type diffusion layer 25. The region where the P type diffusion layer 23 and the N type diffusion layer 25 face each other mainly serves as the parasite current path. Because of the above-described impurity concentration, diffusion shape and disposition region of the P type diffusion layer 23, the parasite Tr1 is turned on preferentially over the parasites Tr2, Tr3.

As has been described, when the vertical PNP transistor is turned on, the parasite Tr1 is turned on, suppressing the parasite Tr2 from being turned on. Moreover, the parasite Tr1 suppresses a current from flowing into the N type buried layer 16 of the parasite Tr2, and suppresses the potential drop at the N type buried layer 16. As a result, in a parasitic PNP transistor Tr4 (hereinafter, referred to as a parasite Tr4) that is constituted of the P type silicon substrate 14, the N type buried layer 16, and the P type buried layer 18, a PN junction region between the N type buried layer 16 as a base region and the P type buried layer 18 as an emitter region is never applied with a voltage in the forward direction of this junction region. By the suppression of the parasite Tr4 from being turned on, a leakage current to the substrate 14 is prevented. In other words, a current is prevented from leaking from the power supply line to the ground line, and the potential of the substrate 14, which has been set to be the ground potential, is prevented from varying. Thus, a malfunction due to a latchup in a peripheral circuit formed on the same semiconductor substrate 14 is prevented.

FIG. 4 illustrates a leakage current into the substrate when the vertical PNP transistor of this embodiment indicated by a solid line and the vertical PNP transistor of the conventional structure indicated by a dashed line are driven in each saturation region. The lateral axis indicates a base current of the vertical PNP transistors, and the longitudinal axis indicates a leakage current into the substrates of the vertical PNP transistors. The measurement conditions such as the size of each vertical PNP transistor and a voltage to be applied are substantially the same.

Figure 8:
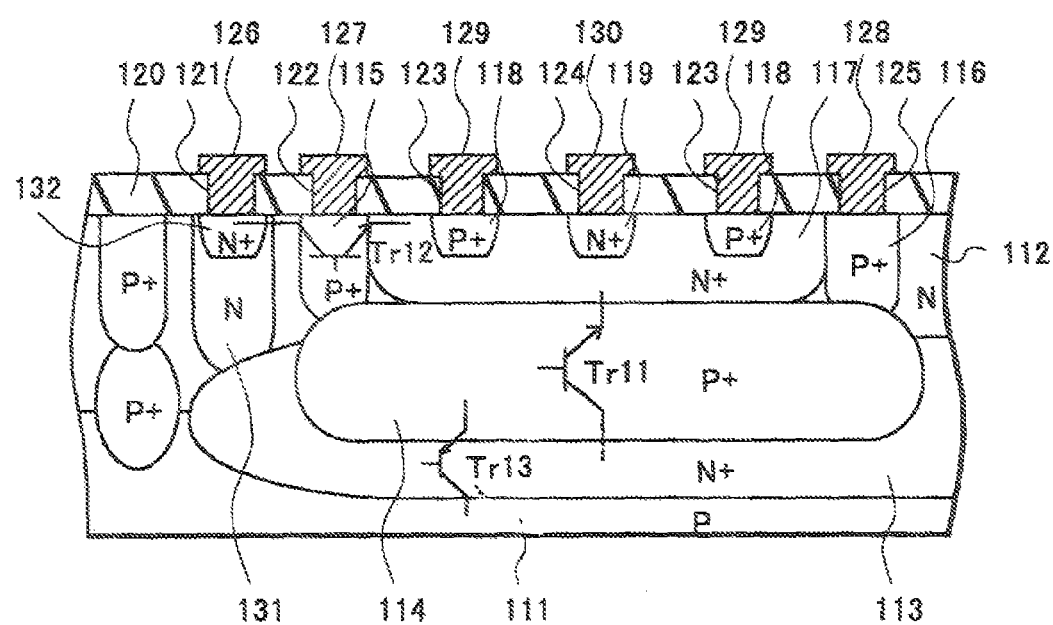
FIG. 8 is a cross-sectional view for describing a semiconductor device of a conventional structure.

Note that the vertical PNP transistor of this embodiment has the structure described with reference to FIG. 1 to FIG. 3B. Meanwhile, in the vertical PNP transistor of the conventional structure, as described with reference to FIG. 8, the P type diffusion layer 118 as the emitter region circularly surrounds the periphery of the N type diffusion layer 119 as the base lead region. Furthermore, in the conventional structure, the impurity concentrations and the diffusion widths of the P type diffusion layer 115 as the collector region are substantially the same as those of the P type diffusion layer 116 as the collector region.

As illustrated, in the vertical PNP transistor of this embodiment, by turning on the parasite Tr1 (see FIG. 3B), the parasite Tr4 (see FIG. 3B) is suppressed from being turned on, and a leakage current into the substrate 14 (see FIG. 3B) is prevented. On the other hand, in the vertical PNP transistor of the conventional structure, for example, a base current of up to 30 mA can be prevented from leaking into the substrate 111 (see FIG. 8) can be prevented. Nevertheless, as the base current is continuously further increased, the leakage current into the substrate 111 is increased. This is because the increase in the base current of the vertical PNP transistor causes the potential drop at the N type buried layer 113 (see FIG. 8). Accordingly, when the base potential of the parasite Tr13 (see FIG. 8) is decreased, the parasite Tr13 is turned on. This contributes to the operation to increase the current value of the parasite Tr13.

To put it another way, in the vertical PNP transistor of this embodiment, by changing the impurity concentrations and the diffusion widths of the P type diffusion layers 22, 23 (see FIG. 3B), the vicinity of the surface of the epitaxial layer 15 (see FIG. 3B) serves as the parasite current path. By suppressing the potential drop at the N type buried layer 16 and suppressing the parasite Tr4 from being turned on, the leakage current into the substrate 14 is prevented.

Note that, in this embodiment, the description has been given of the case where the diffusion width of the P type diffusion layer (the region surrounded by the solid line 4) as the collector region is wider than that of the P type diffusion layer (the region surrounded by the solid line 4 and the chain lines 5, 6) as the collector region, and concurrently where the impurity concentration thereof is higher; however, a preferred embodiment of the present invention is not limited to this case. For example, it is possible to obtain the effect of preventing a leakage current into the substrate 14, even in a structure where only the diffusion width of the P type diffusion layer (the region surrounded by the solid line 4) as the collector region is wider than that of the P type diffusion layer (the region surrounded by the solid line 4 and the chain lines 5, 6) as the collector region. Alternatively, it is possible to obtain the effect of preventing a leakage current into the substrate 14, in a structure where only the impurity concentration of the P type diffusion layer (the region surrounded by the solid line 4) as the collector region is higher than that of the P type diffusion layer (the region surrounded by the solid line 4 and the chain lines 5, 6) as the collector region.

Moreover, in this embodiment, the description has been given of the case where the P type diffusion layer (the region surrounded by the solid line 4) as the collector region is disposed so as to correspond to the one side 13 of the N type diffusion layer (the region surrounded by the chain double-dashed line 7) as the base region; however, a preferred embodiment of the present invention is not limited to this case. For example, the P type diffusion layer (the region surrounded by the solid line 4) as the collector region may be disposed even in a region facing the P type diffusion layer (the region surrounded by the solid line 8) as the emitter region at the two sides 10 and 12 of the N type diffusion layer (the region surrounded by the chain double-dashed line 7). In this case, the formation region of the P type diffusion layer (the region surrounded by the solid line 4) as the collector region of the vertical PNP transistor is increased, and the parasitic resistance in the collector region is reduced. Thus, the current capability is improved. Furthermore, various modifications can be made without departing from the spirit of the present invention.

Figure 5:
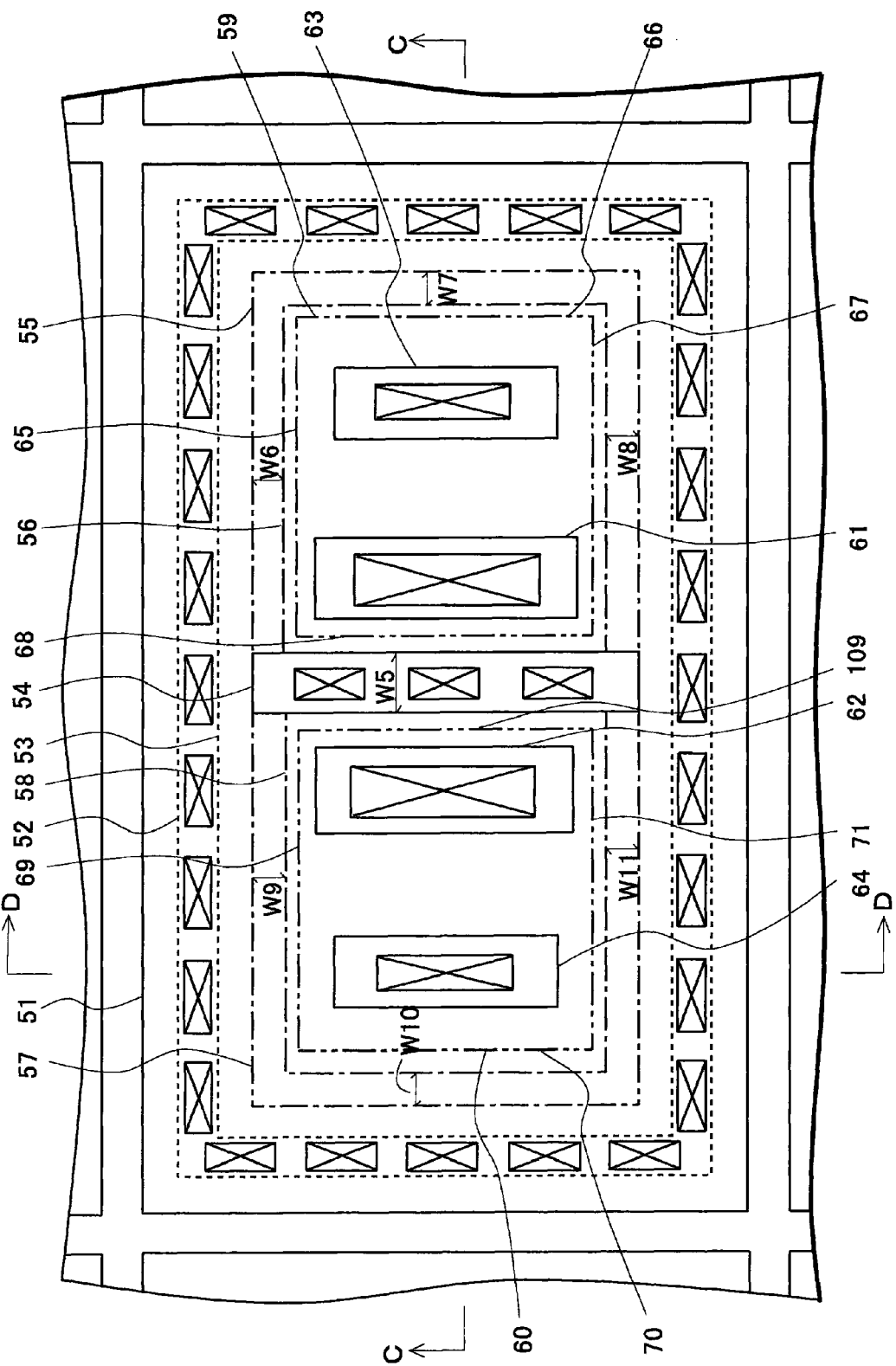
FIG. 5 is a plan view for describing a semiconductor device according to another embodiment of the present invention.
Figure 6:
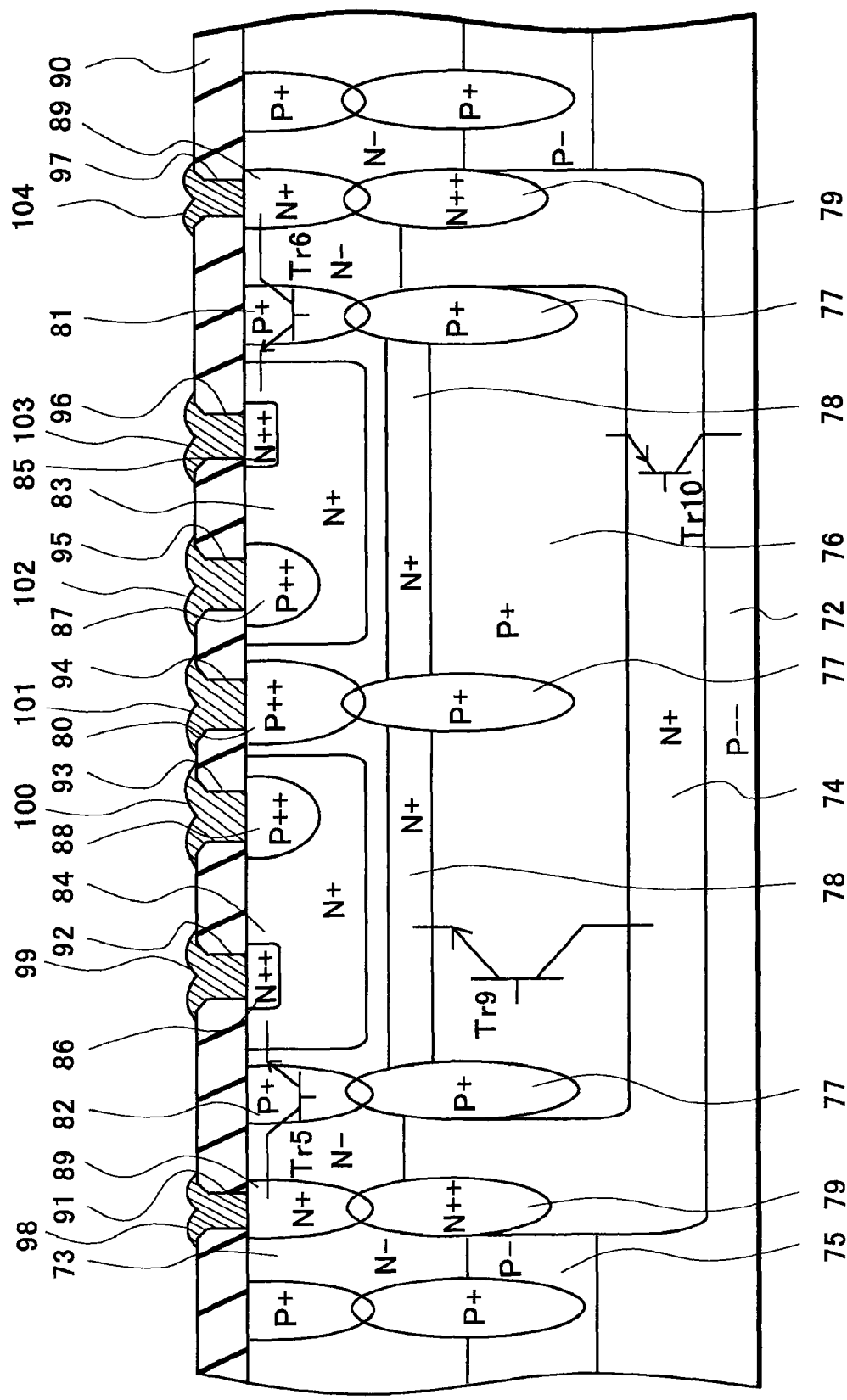
FIG. 6 is a cross-sectional view for describing the semiconductor device according to the embodiment of the present invention.
Figure 7:
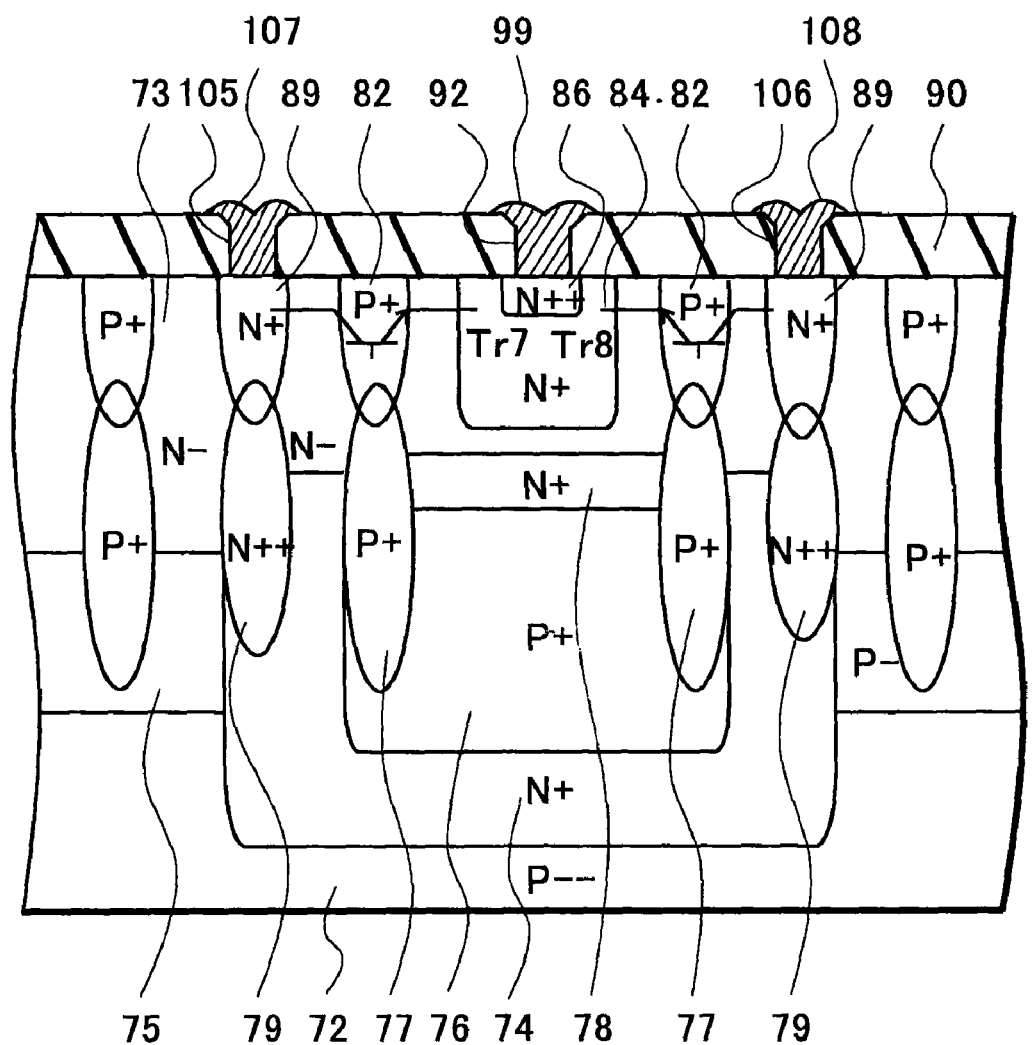
FIG. 7 is a cross-sectional view for describing the semiconductor device according to the embodiment of the present invention.

Hereinafter, specific descriptions will be given of a semiconductor device according to another embodiment of the present invention with reference to FIG. 5 to FIG. 7. A vertical PNP transistor of this embodiment differs from that of the embodiment described with reference to FIG. 1 to FIG. 4 in that N type diffusion layers as base lead regions and P type diffusion layers as emitter regions are symmetrically disposed so as to sandwich P type diffusion layers as collector regions therebetween, thereby increasing the current capability of the vertical PNP transistor. However, when used in the saturation region, as shown in the circuit diagram of FIG. 3A, the vertical PNP transistor has the same characteristic to prevent a leakage current from the power source line to the ground line. FIG. 5 is a plan view for describing the vertical PNP transistor of this embodiment. FIG. 6 is to describe the vertical PNP transistor of this embodiment, and specifically is a cross-sectional view taken in a direction of the line C-C shown in FIG. 5. FIG. 7 is to describe the vertical PNP transistor of this embodiment, and specifically is a cross-sectional view taken in a direction of the line D-D shown in FIG. 5. Hereinbelow, in describing this embodiment, the circuit diagram shown in FIG. 3A will be referred as appropriate.

As shown in FIG. 5, a solid line 51 indicates the edge of a isolation region. The region surrounded by the solid line 51 is where the vertical PNP transistor is formed. The region surrounded by dashed lines 52, 53 indicates an N type diffusion layer formed in an epitaxial layer between the isolation region and a collector region. The region surrounded by a solid line 54 as well as the regions surrounded by the solid line 54 and chain lines 55 to 58 indicate P type diffusion layers as the collector regions. The regions surrounded by chain double-dashed lines 59, 60 indicate N type diffusion layers as base regions. The regions surrounded by solid lines 61, 62 indicate P type diffusion layers as emitter regions. The regions surrounded by solid lines 63, 64 indicate N type diffusion layers as base lead regions.

As illustrated, the P type diffusion layer (the region surrounded by the solid line 54) as the collector region is disposed to a central region where the vertical PNP transistor is formed. The N type diffusion layers (the region surrounded by the chain double-dashed lines 59, 60) as the base regions are disposed symmetrically with respect to the P type diffusion layer (the region surrounded by the solid line 54). Similarly, the P type diffusion layers (the regions surrounded by the solid lines 61, 62) as the emitter regions and the N type diffusion layers (the regions surrounded by the solid lines 63, 64) as the base lead regions are disposed symmetrically with respect to the P type diffusion layer (the region surrounded by the solid line 54).

In the collector region, the P type diffusion layer (the region surrounded by the solid line 54 and the chain lines 55, 56) and the P type diffusion layer (the region surrounded by the solid line 54 and the chain lines 57, 58) are disposed symmetrically with respect to the P type diffusion layer (the region surrounded by the solid line 54). Diffusion widths W6, W7, W8, W9, W1 and W11 of the P type diffusion layers (the regions surrounded by the solid line 54 and the chain lines 55 to 58) are narrower than a diffusion width W5 of the P type diffusion layer (the region surrounded by the solid line 54).

Furthermore, the P type diffusion layer (the region surrounded by the solid line 54 and the chain lines 55, 56) is disposed so as to correspond to three sides 65, 66 and 67 of the N type diffusion layer (the region surrounded by the chain double-dashed line 59). Meanwhile, the P type diffusion layer (the region surrounded by the solid line 54) is disposed so as to correspond to one side 68 of the N type diffusion layer (the region surrounded by the chain double-dashed line 59). Moreover, the P type diffusion layer (the region surrounded by the solid line 61) as the emitter region is disposed so as to face the P type diffusion layer (the region surrounded by the solid line 54) with the one side 68 therebetween. This structure increases a region where the N type diffusion layer (the region surrounded by the solid line 63) as the base lead region faces the P type diffusion layer (the region surrounded by the solid line 54 and the chain lines 55, 56) with the three sides 65 to 67 therebetween. Similarly, in the P type diffusion layer (the region surrounded by the solid line 54 and the chain lines 57, 58), a region where the N type diffusion layer (the region surrounded by the solid line 64) as the base lead region faces the P type diffusion layer (the region surrounded by the solid line 54 and the chain lines 57, 58) with the three sides 69 to 71 therebetween, is increased.

Although a detailed description will be given later, by turning on the vertical PNP transistor, parasitic NPN transistors Tr5, Tr6, Tr7 and Tr8 (hereinafter, referred to as a parasite Tr5, a parasite Tr6, a parasite Tr7 and a parasite Tr8) (see FIG.

6 and FIG. 7) are turned on. Then, the P type diffusion layers (the regions surrounded by the solid line 54 and the chain lines 55 to 58), positioned in the vicinity of the surface of an epitaxial layer 73 (see FIG. 6), mainly serves as a current path of the parasites Tr5 to Tr8.

Nextly, regions of the rectangles marked by X therein in FIG. 5 indicate formation regions of contact holes. In the collector region, the contact holes are disposed on the P type diffusion layer (the region surrounded by the solid line 54), whereas the contact holes are not disposed on the P type diffusion layers (the regions surrounded by the solid line 54 and the chain lines 55 to 58). According to this structure, the diffusion width W5 of the former P type diffusion layer is made wider than the diffusion widths W6 to W11 of the latter P type diffusion layers. Although a detailed description will be given later, by narrowing the diffusion widths W6 to W11 of the P type diffusion layers, the P type diffusion layers (the regions surrounded by the solid line 54 and the chain lines 55 to 58) are made to serve as the current paths of the parasites Tr5 to Tr8.

On the other hand, having a high impurity concentration and the wide diffusion width, the P type diffusion layer (the region surrounded by the solid line 54) mainly functions as the collector region of the vertical PNP transistor. In the collector region of the vertical PNP transistor, the reduction in the contact resistance and the reduction in the parasitic resistance are achieved. Furthermore, the P type diffusion layer (the region surrounded by the solid line 54) as emitter region having the contact holes disposed thereon is disposed in the vicinity of the P type diffusion layers (the regions surrounded by the solid lines 61, 62) respectively serving as the emitter regions. With this structure, the current path of the vertical PNP transistor is shortened, and the parasitic resistance is reduced. Thus, the current capability is improved.

FIG. 6 is the cross-sectional view taken in the direction of the line C-C shown in FIG. 5. The vertical PNP transistor is mainly formed of a P type single crystal silicon substrate 72, the N type epitaxial layer 73, an N type buried layer 74, a P type buried layer 75, P type buried layers 76, 77 used as collector regions, an N type buried layer 78 used as a base region, an N type buried layer 79, P type diffusion layers 80 to 82 used as collector regions, N type diffusion layers 83 to 86 used as base regions, P type diffusion layers 87, 88 used as an emitter region and an N type diffusion layer 89.

The N type epitaxial layer 73 is formed on the P type single crystal silicon substrate 72. Note that, the specific resistance value of the substrate 72 is approximately 40 Ω·cm to 60 Ω·cm, and a substrate having a P type impurity concentration of approximately $3.0 \times 10^{14}$ is used.

The N type buried layer 74 is formed in the substrate 72 and the epitaxial layer 73. The N type buried layer 74 is formed more deeply in the substrate 72 than the P type buried layer 76. Moreover, the N type buried layer 74 forms PN junction regions with the substrate 72 and the P type buried layer 76, respectively, and isolates the substrate 72 and the P type buried layer 76 from each other with the PN junctions.

The P type buried layer 75 is formed in the entire surface of the chip. For example, the P type buried layer 75 is formed to a depth of approximately 15 µm to 20 µm from the surface of the substrate 72. The P type buried layer 75 is formed by implanting ions of a P type impurity, for example, boron (B) at a dose of $1.0 \times 10^{12}/cm^2$ to $1.0 \times 10^{14}/cm^2$. Thus, the P type buried layer 75 is a diffusion region with a low impurity concentration. A region where the P type buried layer 75 overlaps the N type diffusion region acts as an N type region. The formation of the P type buried layer 75 in the substrate 72 prevents the ground resistance from increasing, thus solving the problems such as a latchup. Various design modifications can be made on the impurity concentration of the P type buried layer 75 to obtain a desired ground resistance.

The P type buried layer 76 is formed in the substrate 72 and the epitaxial layer 73. This forming of the P type buried layer 76 in the substrate 72 and the epitaxial layer 73 reduces the collector resistance.

The P type buried layer 77 is formed in the epitaxial layer 73. The P type buried layer 77 is circularly formed around the edge portion of the P type buried layer 76 so that the P type buried layer 77 can overlap the P type buried layer 76.

The N type buried layer 78 expands upward at least from the upper surface of the P type buried layer 76 toward the top surface of the epitaxial layer 73. Meanwhile, the N type buried layer 79 is circularly formed in the edge portion of the N type buried layer 74. Moreover, the P type buried layer 77 is disposed around and in the central region of the N type buried layer 78, and some regions of the N type buried layer 78 and the P type buried layer 77 overlap each other. Furthermore, the N type buried layer 79 is disposed around the P type buried layers 76, 77.

With this structure, the upward expansion width of the P type buried layer 76 in the formation region of the N type buried layer 78 is suppressed to be approximately 1.5 µm to 3.5 µm, thus forming a vertical PNP transistor in which a desired width of the base region is secured. By securing such a desired width of the base region, it is possible to reduce the film thickness of the epitaxial layer 73 while maintaining the breakdown voltage characteristic of the vertical PNP transistor. Additionally, the device size (the size in a thickness direction) is reduced.

The P type diffusion layers 80 to 82 are formed in the epitaxial layer 73 by, for example, an ion implantation technique. The P type diffusion layers 80 to 82 are connected to the P type buried layer 77. As illustrated, the diffusion width of the P type diffusion layer 80 is wider than those of the P type diffusion layers 81, 82. The impurity concentration of the P type diffusion layer 80 is higher than those of the P type diffusion layers 81, 82. Specifically, in the vicinity of the surface of the P type diffusion layer 80, the diffusion width W5 (see FIG. 5) is approximately 14 µm, and the impurity concentration thereof is approximately $5.0 \times 10^{18}/cm^3$ to $2.0 \times 10^{20}/cm^3$. Meanwhile, in the vicinity of the surfaces of the P type diffusion layers 81, 82, the diffusion widths W7, W10 (see FIG. 5) are approximately 7 µm, and the impurity concentrations thereof are approximately $5.0 \times 10^{17}/cm^3$ to $1.0 \times 10^{19}/cm^3$. Note that, the P type diffusion layer 80 corresponds to the region surrounded by the solid line 54 in FIG. 5, while the P type diffusion layers 81, 82 correspond to the regions surrounded by the solid line 54 and the chain lines 55 to 58 in FIG. 5.

The N type diffusion layers 83 to 86 are formed in the epitaxial layer 73. The N type diffusion layers 85, 86 are used as the base lead regions. By forming the N type diffusion layers 85, 86, the contact resistance is reduced. Note that, the N type diffusion layers 83, 84 respectively correspond to the regions surrounded by the chain double-dashed lines 59, 60 in FIG. 5, while the N type diffusion layers 85, 86 respectively correspond to the regions surrounded by the solid lines 63, 64 in FIG. 5.

The P type diffusion layers 87, 88 are formed in the N type diffusion layers 83, 84, respectively. Note that the P type diffusion layers 87, 88 respectively correspond to the regions surrounded by the solid lines 61, 62 in FIG. 5.

The N type diffusion layer 89 is formed in the epitaxial layer 73. The N type diffusion layer 89 is circularly formed so as to surround the P type diffusion layers 81, 82. The N type diffusion layer 89 and the N type buried layer 79 are connected to each other. Specifically, by disposing the N type diffusion layer 89 circularly on the outer periphery of the P type diffusion layers 81, 82 serving as the collector regions, the surface of the epitaxial layer 73 is inverted. This prevents the collector current from flowing into the substrate 72 via the isolation region. Note that the N type diffusion layer 89 corresponds to the region surrounded by the dashed lines 52, 53 in FIG. 5.

An insulating layer 90 is formed on the epitaxial layer 73. Then, contact holes 91 to 97 are formed in the insulating layer 90 by dry etching using, for example, $CHF_3$ or $CF_4$ gas.

In the contact holes 91 to 97, aluminum alloy films such as an Al—Si film are selectively formed. Accordingly, electrodes 98, 104, a collector electrode 101, emitter electrodes 100, 102 and base electrodes 99, 103 are formed therein.

FIG. 7 shows the cross-sectional view taken in the direction of the line D-D shown in FIG. 5. The components of the vertical PNP transistor, which have been described with reference to FIG. 6, are denoted by the same reference numerals, and the descriptions thereof will be omitted. Meanwhile, the cross section structure shown in FIG. 7 is different from the cross section structure shown in FIG. 6 in that the former structure has a region where the P type diffusion layers 87, 88 (see FIG. 6) as the emitter regions are not disposed between the N type diffusion layer 86 as the base lead region and the P type diffusion layer 82 as the collector region.

Note that contact holes 105, 106 are formed in the insulating layer 90 by a known photolithography technique such as dry etching using $CHF_3$ or $CF_4$ gas. Then, in the contact holes 105, 106, aluminum alloy films such as an Al—Si film are selectively formed. Accordingly, electrodes 107, 108 that are connected to the N type diffusion layer 89 are formed therein. As illustrated, without the collector electrode formed on the P type diffusion layer 82, the P type diffusion layer 82 mainly serves as current paths of the parasites Tr7, Tr8.

As has been described with reference to FIG. 3A, a description will be given of a case where the vertical PNP transistor having been described with reference to FIG. 5 to FIG. 7 is used in a saturation region.

As shown in FIG. 6, the emitter electrodes 100, 102 of the vertical PNP transistor are applied with a power supply voltage V1 (for example, 13.0 V). The collector electrode 101 is applied with a voltage (for example, 12.9 V) which is substantially the same as the power supply voltage V1 (the voltage (12.9 V) having a 0.3 or less potential difference from the power supply voltage V1), the voltage having been adjusted with a resistance R1 (for example, 12 kΩ). The base electrodes 99, 103 are applied with a desired voltage (for example, 12.3 V) by a variable voltage V2. Thus, the vertical PNP transistor is turned on. Note that the power supply voltage V1 is applied to the electrodes 98, 104 connected to the epitaxial layer 73 that is positioned on the outer sides of the P type diffusion layers 81, 82.

After the vertical PNP transistor is turned on, the voltages applied to the base electrodes 99, 103 are decreased to 12.1 V, and the base currents are increased. Then, the parasites Tr5, Tr6 that is constituted of the N type diffusion layer 89 (including the N type epitaxial layer 73 positioned outside the P type diffusion layers 81, 82), the P type diffusion layers 81, 82 and the N type diffusion layers 83 to 86 (including the N type epitaxial layer 73 positioned on the inner side of the P type diffusion layers 81, 82) are turned on.

At this moment, a voltage which is substantially the same as those applied to the parasites Tr5, Tr6 is applied to a parasitic NPN transistor Tr9 (hereinafter, referred to as a parasite Tr9) that is constituted of the N type buried layer 74, the P type buried layer 76 and the N type buried layer 78. Nonetheless, the base widths of the parasites Tr5, Tr6 are narrower than that of the parasite Tr9, and the impurity concentrations in the base regions of the parasites Tr5, Tr6 are also low. For this reason, the base currents are decreased, thereby increasing the current amplification factors (hFE). With this structure, the parasites Tr5, Tr6 are turned on, and regions, in the vicinity of the surface of the epitaxial layer 73, where the P type diffusion layers 81, 82 are disposed, serves as the current paths of the parasites Tr5, Tr6.

As has been described, when the vertical PNP transistor is turned on, the parasites Tr5 to Tr8 are turned on, suppressing the parasite Tr9 from being driven. Moreover, the parasites Tr5 to Tr8 suppress a current from flowing into the N type buried layer 74 of the parasite Tr9, and suppress the potential drop at the N type buried layer 74. As a result, in a parasitic PNP transistor Tr10 (hereinafter, referred to as a parasite Tr10) that is constituted of the substrate 72, the N type buried layer 74 and the P type buried layer 76, a PN junction region between the N type buried layer 74 as a base region and the P type buried layer 76 as an emitter region is never applied with a voltage in the forward direction of this junction region. By the suppression of the parasite Tr10 from being turned on, a leakage current to the substrate 72 is prevented. In other words, a current is prevented from leaking from the power supply line to the ground line, and the potential of the substrate 72, which has been set to be the ground potential, is prevented from varying.

Note that, in this embodiment, the description has been given of the case where the diffusion width of the P type diffusion layer (the region surrounded by the solid line 54) as the collector region is wider than those of the P type diffusion layers (the regions surrounded by the solid line 54 and the chain lines 55 to 58) as the collector regions, and concurrently where the impurity concentration thereof is higher. However, a preferred embodiment of the present invention is not limited to this case, For example, it is possible to obtain the effect of preventing a leakage current into the substrate 72, even in a structure where only the diffusion width of the P type diffusion layer (the region surrounded by the solid line 54) as the collector region is wider than those of the P type diffusion layers (the regions surrounded by the solid line 54 and the chain lines 55 to 58) as the collector regions. Alternatively, it is possible to obtain the effect of preventing a leakage current into the substrate 72, in a structure where only the impurity concentration of the P type diffusion layer (the region surrounded by the solid line 54) as the collector region is higher than those of the P type diffusion layers (the regions surrounded by the solid line 54 and the chain lines 55 to 58) as the collector regions.

Moreover, in this embodiment, the description has been given of the case where the P type diffusion layer (the region surrounded by the solid line 54) as the collector region is disposed so as to correspond to the two sides 68, 109 of the N type diffusion layers (the regions surrounded by the chain double-dashed lines 59, 60) as the base regions. However, a preferred embodiment of the present invention is not limited to this case. For example, the P type diffusion layer (the region surrounded by the solid line 54) as the collector region may be even in a regions facing the P type diffusion layers (the regions surrounded by the solid line 61, 62) as the emitter regions at the sides 65, 67, 69 and 71 of the N type diffusion layers (the regions surrounded by the chain double-dashed lines 59, 60). In this case, the formation region of the P type diffusion layer (the region surrounded by the solid line 54) as the collector region of the vertical PNP transistor is increased, and the parasitic resistance in the collector region is reduced.

Thus, the current capability is improved. Furthermore, various modifications can be made without departing from the spirit of the present invention.

In the present invention, a collector diffusion layer is formed around a base diffusion layer. The collector diffusion layer is formed of two diffusion layers whose impurity concentrations and diffusion widths are different from each other. With such a structure, a parasite current flows in the vicinity of the surface of a semiconductor layer, preventing a parasitic transistor, including a substrate, from turning on. Thereby, a leakage current into the substrate is prevented.

Moreover, in the present invention, the diffusion layer used as the collector region of a vertical PNP transistor is disposed in the vicinity of a diffusion layer used as an emitter region. Thereby, the parasitic resistance is reduced, and the current capability of vertical PNP transistor is improved.

Moreover, in the present invention, contact holes are disposed only on the diffusion layer used as the collector region of the vertical PNP transistor. This structure causes a parasite current to be generated in the vicinity of the surface of the semiconductor layer while reducing the parasitic resistance in the vertical PNP transistor.

Moreover, among the diffusion layers used as the collector region of the vertical PNP transistor, the diffusion layer used as a parasitic transistor according to the present invention is disposed in a U-like shape in the vicinity of a diffusion layer as a base lead region. With this structure, a parasite current flows preferentially in the vicinity of the surface of the semiconductor layer, and thereby a leakage current into the substrate is prevented.

Moreover, in the present invention, an N type diffusion layer applied with a power supply voltage isolates the P type semiconductor substrate and the collector diffusion layer from each other, thereby preventing a leakage current into the substrate.

What is claimed is:

1. A semiconductor device comprising an epitaxial semiconductor layer including in which are formed:
   a base diffusion layer of one conductivity type,
   a base lead diffusion layer of the one conductivity type, formed to overlap the base diffusion layer,
   an emitter diffusion layer of an opposite conductivity type, formed to overlap the base diffusion layer, and
   a collector diffusion layer of the opposite conductivity type, formed at an upper surface of the epitaxial layer around the base diffusion layer, wherein the collector diffusion layer includes:
      a first diffusion layer of the opposite conductivity type extending from the upper surface of the epitaxial layer, and
      a second diffusion layer of the opposite conductivity type extending from the upper surface of the epitaxial layer, formed to have a higher impurity concentration than the first diffusion layer,
      wherein the first diffusion layer has a region where the first diffusion layer faces the base lead diffusion layer without the emitter diffusion layer therebetween.

2. The semiconductor device according to claim 1 wherein the second diffusion layer is formed to have a diffusion width wider than the first diffusion layer.

3. The semiconductor device according to any one of claims 1 and 2 wherein
   the emitter diffusion layer is disposed between the second diffusion layer and the base lead diffusion layer.

4. The semiconductor device according to any one of claims 1 and 2, further comprising,
   an insulating layer formed on the semiconductor layer; and
   a contact hole, formed only in the insulating layer on the second diffusion layer, for connecting a collector electrode to the second diffusion layer.

5. The semiconductor device according to any one of claims 1 and 2 wherein
   the base diffusion layer, the base lead diffusion layer and the emitter diffusion layer are each disposed as a pair symmetrical with respect to the second diffusion layer, and
   the base lead diffusion layer is disposed farther from the second diffusion layer than the emitter diffusion layer is.

6. The semiconductor device according to any one of claims 1 and 2 wherein
   the semiconductor layer further includes,
      a diffusion layer of the one conductivity type, formed around the collector diffusion layer,
      a buried diffusion layer of the one conductivity type; connected to the diffusion layer of the one conductivity type, and
      a buried diffusion layer of the opposite conductivity type, connected to the collector diffusion layer,
   the diffusion layer of the one conductivity type is applied with a higher voltage than the collector diffusion layer, and
   the buried diffusion layer of the one conductivity type is formed while overlapping the buried diffusion layer of the opposite conductivity type.

* * * * *